(12) United States Patent
Goshima et al.

(10) Patent No.: US 10,714,311 B2
(45) Date of Patent: Jul. 14, 2020

(54) INDIVIDUAL BEAM DETECTOR FOR MULTIPLE BEAMS, MULTI-BEAM IRRADIATION APPARATUS, AND INDIVIDUAL BEAM DETECTION METHOD FOR MULTIPLE BEAMS

(71) Applicants: NuFlare Technology, Inc., Yokohama-shi (JP); NuFlare Technology America, Inc., Sunnyvale, CA (US)

(72) Inventors: Yoshikuni Goshima, Yokohama (JP); Victor Katsap, Cornwall, NY (US); Rodney Kendall, Ridgefield, CT (US)

(73) Assignees: NuFlare Technology, Inc., Yokohama-shi (JP); NuFlare Technology America, Inc., Sunnyvale, CA (US)

( * ) Notice: Subject to any disclaimer, the term of this patent is extended or adjusted under 35 U.S.C. 154(b) by 23 days.

(21) Appl. No.: 16/179,731

(22) Filed: Nov. 2, 2018

(65) Prior Publication Data

US 2019/0139739 A1 May 9, 2019

Related U.S. Application Data

(60) Provisional application No. 62/581,382, filed on Nov. 3, 2017.

(51) Int. Cl.
*H01J 37/00* (2006.01)
*H01J 37/304* (2006.01)
(Continued)

(52) U.S. Cl.
CPC ........ *H01J 37/3045* (2013.01); *G03F 7/2059* (2013.01); *G03F 7/70383* (2013.01);
(Continued)

(58) Field of Classification Search
CPC .. H01J 37/3045; H01J 37/244; H01J 37/3177; H01J 37/28; H01J 37/045;
(Continued)

(56) References Cited

U.S. PATENT DOCUMENTS

2013/0032713 A1 2/2013 Barbi et al.
2018/0040455 A1* 2/2018 Yamashita .......... H01J 37/3007

FOREIGN PATENT DOCUMENTS

JP 2944559 B2 6/1999
JP 2005-340229 12/2005
JP 2018-026544 A 2/2018

OTHER PUBLICATIONS

Combined Office Action and Search Report dated Jul. 25, 2019 in Taiwanese Patent Application No. 107138526 (with unedited computer generated English translation and English translation of categories of cited documents).

(Continued)

*Primary Examiner* — Michael Maskell
(74) *Attorney, Agent, or Firm* — Oblon, McClelland, Maier & Neustadt, L.L.P.

(57) ABSTRACT

An individual beam detector for multiple beams includes a thin film in which a passage hole smaller than a pitch between beams of multiple beams and larger than the diameter of a beam is formed and through which the multiple beams can penetrate, a support base to support the thin film in which an opening is formed under the region including the passage hole, and the width size of the opening is formed to have a temperature of the periphery of the passage hole higher than an evaporation temperature of impurities adhering to the periphery in the case that the thin film is irradiated with the multiple beams, and a sensor arranged, at the position away from the thin film by a distance based on which a detection target beam having (Continued)

passed the passage hole can be detected by the sensor as a detection value with contrast discernible.

12 Claims, 13 Drawing Sheets

(51) Int. Cl.
    *G03F 7/20*     (2006.01)
    *H01J 37/317*     (2006.01)
    *H01J 37/244*     (2006.01)

(52) U.S. Cl.
    CPC ........ *G03F 7/70825* (2013.01); *H01J 37/244* (2013.01); *H01J 37/3177* (2013.01)

(58) Field of Classification Search
    CPC .... H01J 2237/24514; H01J 2237/0435; G03F 7/70383; G03F 7/2059; G03F 7/70825
    USPC ... 250/398, 306, 307, 310, 311, 492.1–492.3
    See application file for complete search history.

(56) References Cited

OTHER PUBLICATIONS

Office Action dated Apr. 16, 2020, in Korean Patent Application No. 10-2018-0130070 w/English-language Translation.

\* cited by examiner

INDIVIDUAL BEAM DETECTOR FOR MULTIPLE BEAMS, MULTI-BEAM IRRADIATION APPARATUS, AND INDIVIDUAL BEAM DETECTION METHOD FOR MULTIPLE BEAMS

CROSS-REFERENCE TO RELATED APPLICATION

This application is based upon and claims the benefit of priority from U.S. Patent Application No. 62/581,382 filed on Nov. 3, 2017 in U.S.A., the entire contents of which are incorporated herein by reference.

BACKGROUND OF THE INVENTION

Field of the Invention

Embodiments of the present invention relate to an individual beam detector for multiple beams ((that is, a detector for individual beam of multiple beams), a multi-beam irradiation apparatus, and an individual beam detection method for multiple beams, and, for example, to a detector for detecting an individual beam in multi-beam (multiple beam) writing.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits becomes progressively narrower year by year. The electron beam writing technique, which intrinsically has excellent resolution, is used for writing or "drawing" a mask pattern on a mask blank with electron beams.

For example, as a known example of employing the electron beam writing technique, there is a writing apparatus using multiple beams. Since it is possible for multi-beam (multiple beam) writing to irradiate multiple beams at a time, the writing throughput can be greatly increased in comparison with single electron beam writing. For example, a writing apparatus employing the multi-beam technique forms multiple beams by letting portions of an electron beam emitted from an electron gun individually pass through a corresponding one of a plurality of holes in a mask, performs blanking control for each beam, reduces each unblocked beam by the optical system, and deflects each reduced beam by a deflector to irradiate a desired position on a target object or "sample".

For highly precisely maintaining the irradiation position of multiple beams on the surface of the target object, it is important to individually high-accurately ascertain (grasp) the position of each beam, which configures the multiple beams, on the surface of the target object. If the number of beams is small, such as around hundreds of beams, and the pitch between beams is large enough, the position of each beam can be measured by arranging marks on the stage for respective beams whose number is the same as that of the beams, and scanning each mark corresponding to each beam (e.g., Japanese Unexamined Patent Publication No. 2009-009882). However, with recent micro circuit patterning, the multiple beams need to have more number of beams in order to greatly improve the throughput. Therefore, with the increase in the number of beams, the beam diameter becomes small and the pitch between beams becomes narrow.

Thus, as the number of beams increases and the pitch between beams narrows, it is not easy to individually detect each beam one by one from irradiated multiple beams by using the mark arranged on the stage. In an example using a reflection mark, a detector is examined which scans marks sequentially with a beam group (beams in one row) restricted from the multiple beams in order to detect secondary electrons (e.g., Japanese Unexamined Patent Publication No. 2004-071691). However, in such a configuration, a mechanism which makes beams other than the ones in one row beam-off is needed in addition to the detector described above. In an example using a transmission mark, a detector is examined which opens a minute hole in heavy metal as thick as possible, and blocks beams other than one beam passing through the minute hole by the heavy metal in order to acquire sufficient contrast from the other beams, for example. However, this detector has a problem in that the minute hole is closed with adhering impurities in a short period of time though the contrast can be acquired. For example, such a minute hole is closed in several hours.

BRIEF SUMMARY OF THE INVENTION

According to one aspect of the present invention, an individual beam detector for multiple beams includes:

a thin film configured in which a passage hole smaller than a pitch between beams of multiple beams each being an electron beam and larger than a diameter of a beam of the multiple beams is formed, and through which the multiple beams can penetrate;

a support base configured to support the thin film, in which an opening is formed under a region including the passage hole in the thin film, and a width size of the opening is formed to have a temperature of a periphery of the passage hole in the thin film higher than an evaporation temperature of impurities adhering to the periphery in a case that the thin film is irradiated with the multiple beams; and a sensor arranged, in a case where a surface of the thin film is scanned with the multiple beams, at a position away from the thin film by a distance based on which a detection target beam having passed through the passage hole of the thin film can be detected by the sensor as a detection value with contrast discernible from beams which have penetrated the thin film and are passing the opening without being blocked by the support base.

According to another aspect of the present invention, a multi-beam irradiation apparatus includes:

a stage configured to mount thereon a target object;

an emission source configured to emit an electron beam;

a shaping aperture array substrate configured to form multiple beams by being irradiated with the electron beam, and making portions of the electron beam individually pass therethrough;

an electron optical system configured to irradiate the target object with the multiple beams; and an individual beam detector to be arranged on the stage and to individually detect each beam of the multiple beams, the individual beam detector including:

a thin film in which a passage hole smaller than a pitch between beams of the multiple beams each being the electron beam and larger than a diameter of a beam of the multiple beams is formed, and through which the multiple beams can penetrate, a support base to support the thin film, in which an opening is formed under a region including the passage hole in the thin film, and a width size of the opening is formed to have a temperature of a periphery of the passage hole in the thin film higher than an evaporation temperature of impurities adhering to the periphery in a case that the thin film is irradiated with the multiple beams, and a sensor arranged, in a case where the thin film is scanned with the multiple beams, at a position away from the thin film by a distance based on which a detection target beam having passed through the passage hole of the thin film can be detected by the sensor as a detection value with contrast discernible from beams which have penetrated the thin film and are passing the opening without being blocked by the support base.

According to yet another aspect of the present invention, an individual beam detection method includes:

irradiating, with multiple beams each being an electron beam, a thin film in which a passage hole smaller than a pitch between beams of the multiple beams and larger than a diameter of a beam of the multiple beams is formed;

making a beam of the multiple beams pass through the passage hole and making beams around the beam penetrate the thin film, while maintaining a temperature of a periphery of the passage hole in the thin film to be higher than an evaporation temperature of impurities adhering to the periphery; and detecting the beam having passed through the passage hole by a sensor arranged at a position away from the thin film by a distance based on which the beam having passed through the passage hole can be detected by the sensor as a detection value with contrast discernible from the beams which have penetrated the thin film.

DETAILED DESCRIPTION OF THE INVENTION

Embodiments below describe an individual beam detector for multiple beams (that is, a detector for individual beam of multiple beams) which can avoid being closed with impurities in a short period of time, an apparatus in which the individual beam detector is provided, and a method of detection.

Moreover, Embodiments below describe a multi-beam writing apparatus as an example of the apparatus in which an individual beam detector is provided. However, it is not limited thereto, and, for example, as long as it is an apparatus which irradiates multiple beams, such as an inspection apparatus for inspecting a defect of a pattern, the individual beam detector can be provided similarly.

First Embodiment

Figure 1:
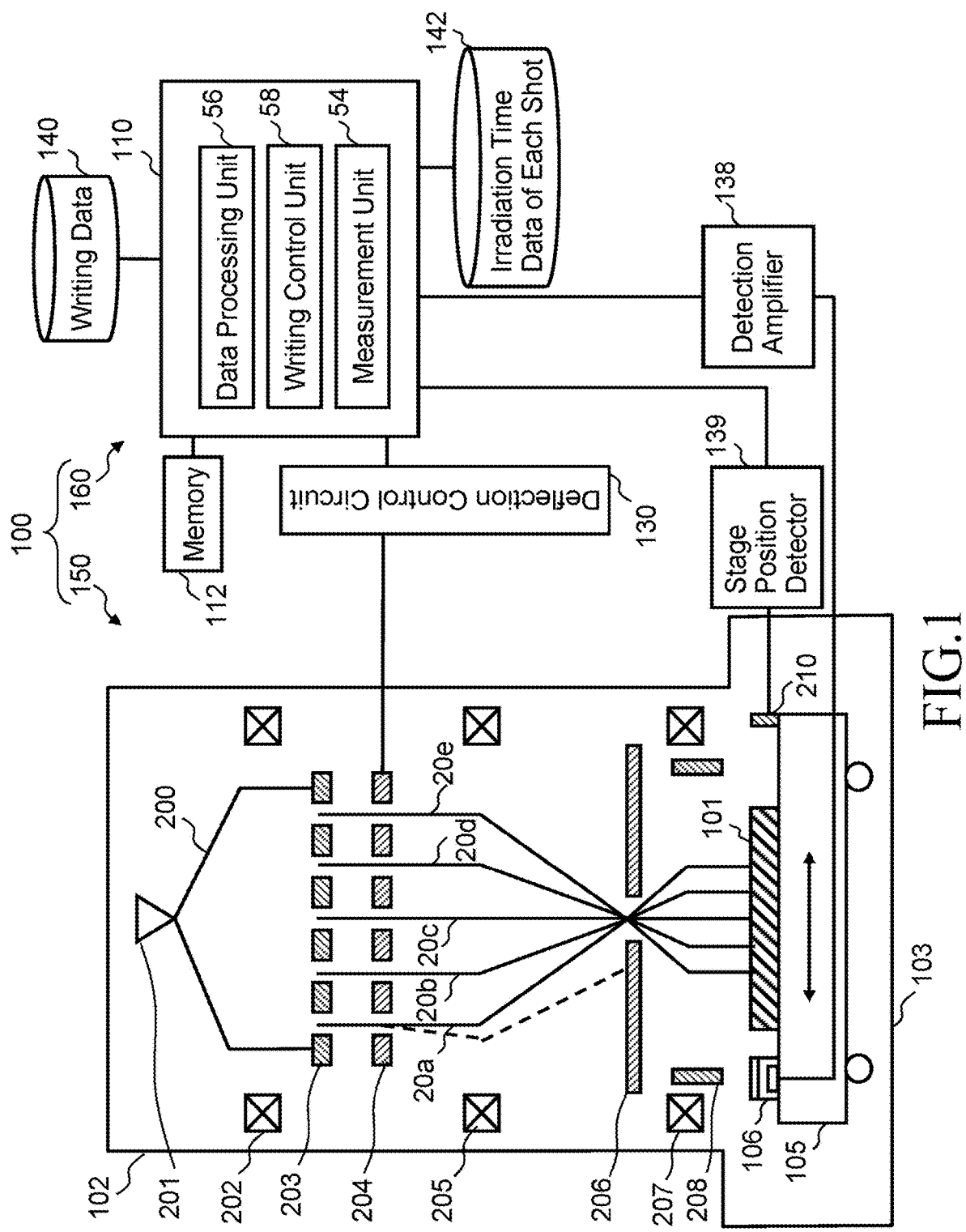
FIG. 1 is a schematic diagram showing a configuration of a writing apparatus according to a first embodiment.

FIG. 1 is a schematic diagram showing a configuration of a writing or "drawing" apparatus according to a first embodiment. As shown in FIG. 1, a writing apparatus 100 includes a writing mechanism 150 and a control system circuit 160. The writing apparatus 100 is an example of a multi charged particle beam writing apparatus. The writing mechanism 150 includes an electron optical column 102 and a writing chamber 103. In the electron optical column 102, there are arranged an electron gun 201, an illumination lens 202, a shaping aperture array substrate 203, a blanking aperture array mechanism 204, a reducing lens 205, a limiting aperture substrate 206, an objective lens 207, and a deflector 208. In the writing chamber 103, there is arranged an XY stage 105. On the XY stage 105, a target object or "sample" 101 such as a mask blank, serving as a writing target substrate, is placed when writing is performed. The target object 101 is, for example, an exposure mask used for fabricating semiconductor devices, or a semiconductor substrate (silicon wafer) on which a semiconductor device is fabricated. A mirror 210 for measuring the position of the XY stage 105 is arranged on the XY stage 105. Moreover, an individual beam detector 106 of the transmission mark type is arranged on the XY stage 105. It is preferable for the top surface height of the individual beam detector 106, which a beam scans, to be arranged at substantially the same height as that of the surface position of the target object 101, or arranged to be height-adjustable.

The control circuit 160 includes a control computer 110, a memory 112, a deflection control circuit 130, a detection amplifier 138, a stage position detector 139, and storage devices 140 and 142 such as magnetic disk drives. The control computer 110, the memory 112, the deflection control circuit 130, the detection amplifier 138, the stage position detector 139, and the storage devices 140 and 142 are connected with each other through a bus (not shown). Writing data is input from the outside of the writing apparatus 100 to the storage device 140 (storage unit), and stored therein.

In the control computer 110, there are arranged a measurement unit 54, a data processing unit 56, and a writing control unit 58. Each of " . . . units" such as the measurement unit 54, the data processing unit 56, and the writing control unit 58 includes a processing circuitry. As the processing circuitry, for example, an electric circuit, computer, processor, circuit board, quantum circuit, or semiconductor device is used. Each " . . . unit" may use a common processing circuitry (same processing circuitry), or different processing circuitries (separate processing circuitries). Information input and output to/from the measurement unit 54, the data processing unit 56, and the writing control unit 58, and information being operated are stored in the memory 112 each time.

FIG. 1 shows structure elements necessary for describing the first embodiment. It should be understood that other structure elements generally necessary for the writing apparatus 100 may also be included therein.

Figure 2:
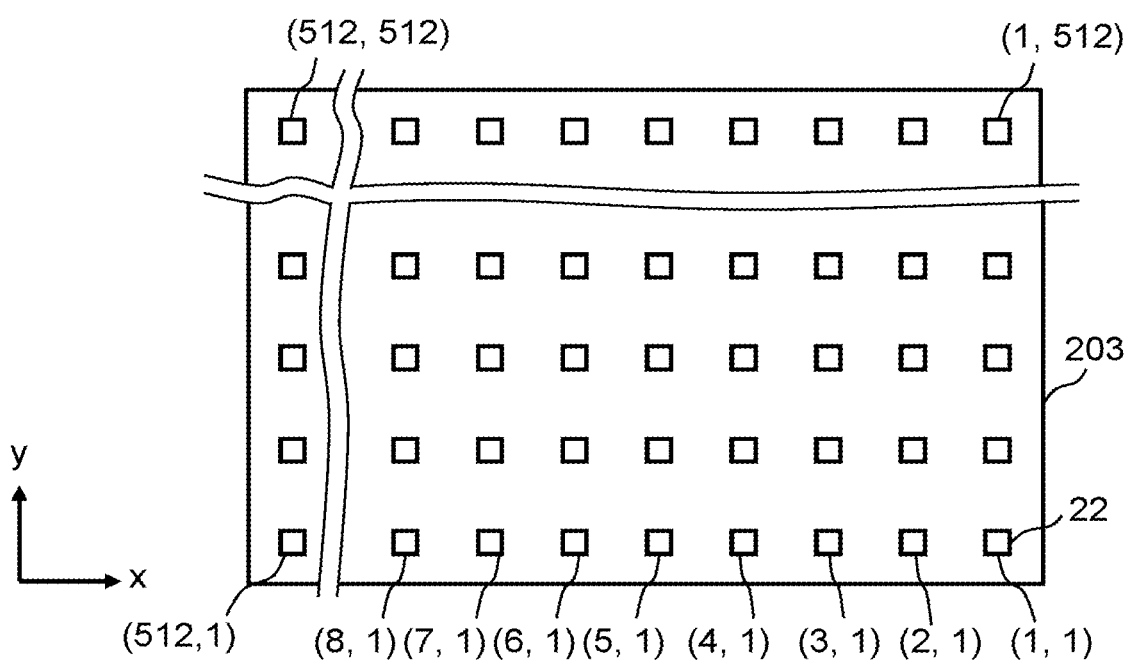
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings, apertures) 22 of p rows long (length in the y direction) and q columns wide (width in x direction) (p≥2, q≥2) are formed, like a matrix, at a predetermined arrangement pitch in the shaping aperture array substrate 203. In FIG. 2, for example, holes 22 of 512 (rows of holes arrayed in y direction)×512 (columns of holes arrayed in x direction) are formed. Each of the holes 22 is a quadrangle (rectangle) having the same dimension and shape. Alternatively, each of the holes 22 may be a circle with the same diameter. Multiple beams 20 are formed by making portions of an electron beam 200 individually pass through a corresponding hole of a plurality of holes 22. Shown here is the case where the holes 22 of two or more rows and columns are arranged horizontally and vertically (in x and y directions), but the arrangement is not limited thereto. For example, it is also acceptable that a plurality of holes 22 are arranged in only one row (x direction) or in only one column (y direction). That is, in the case of only one row, a plurality of holes 22 are arranged in the x direction as a plurality of columns, and in the case of only one column, a plurality of holes 22 are arranged in the y direction as a plurality of rows. Moreover, the method of arranging the holes 22 is not limited to the case of FIG. 2 where holes are arranged like a grid in the length and width directions. For example, with respect to the kth and the (k+1)th rows which are arrayed (accumulated) in the length direction (y direction), each hole in the kth row and each hole in the (k+1)th row may be mutually displaced in the width direction (x direction) by a dimension "a". Similarly, with respect to the (k+1)th and the (k+2)th rows which are arrayed (accumulated) in the length direction (y direction), each hole in the (k+1)th row and each hole in the (k+2)th row may be mutually displaced in the width direction (x direction) by a dimension "b", for example.

Figure 3:
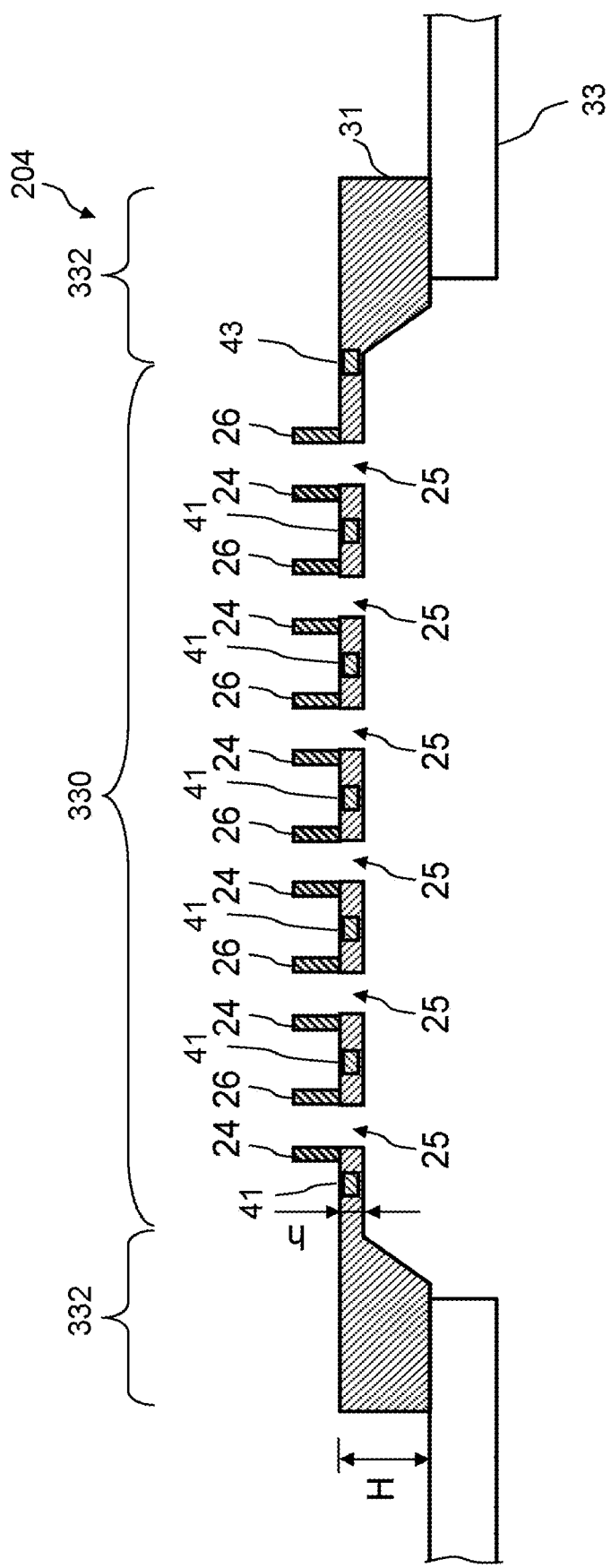
FIG. 3 is a sectional view showing a configuration of a blanking aperture array mechanism according to the first embodiment.

FIG. 3 is a sectional view showing a configuration of a blanking aperture array mechanism according to the first embodiment.

Figure 4:
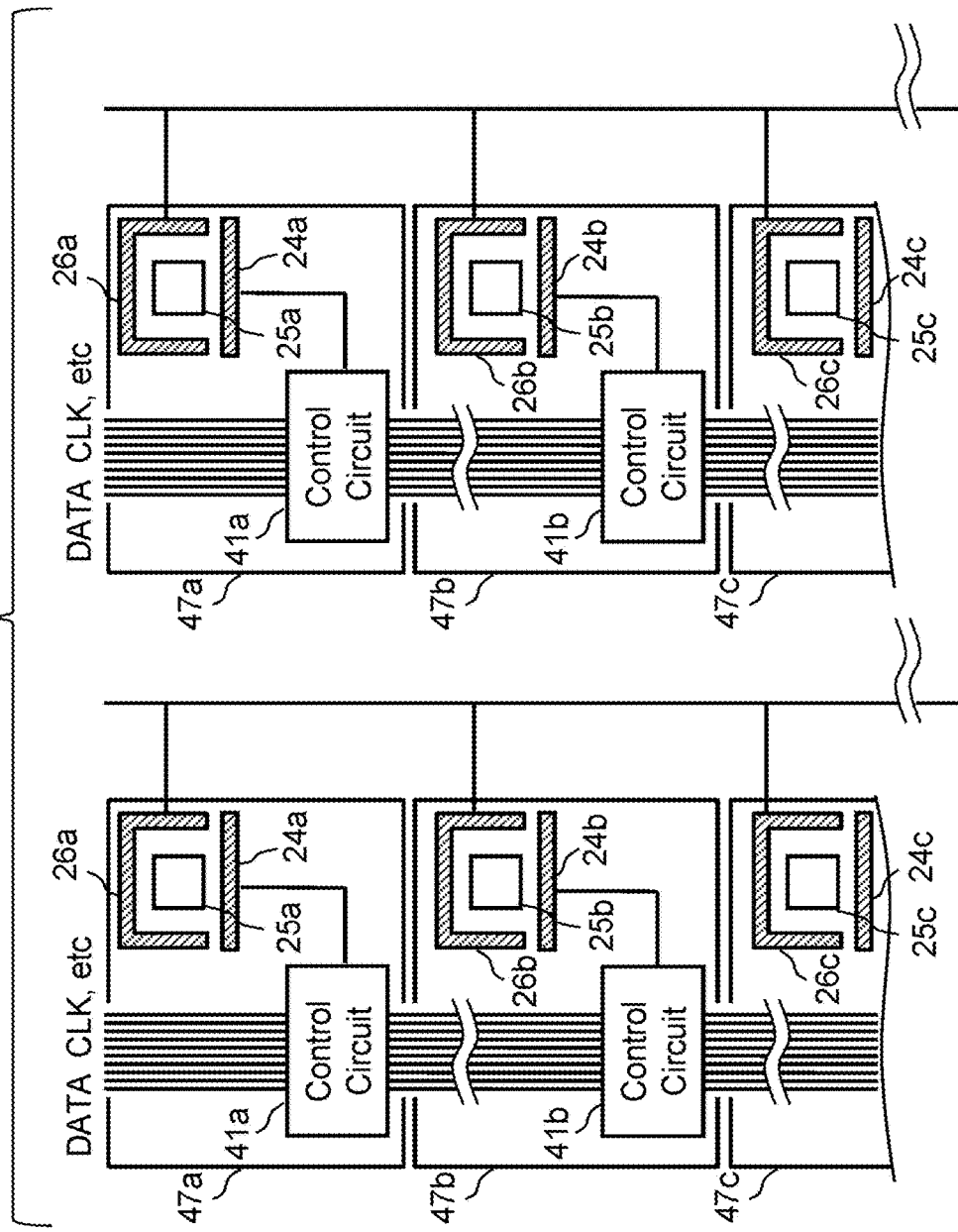
FIG. 4 is a top view conceptual diagram showing a portion of the structure in a membrane region of a blanking aperture array mechanism according to the first embodiment.

FIG. 4 is a top view conceptual diagram showing a portion of the structure in a membrane region of a blanking aperture array mechanism according to the first embodiment. The position relation of a switching electrode 24, a counter electrode 26, and a control circuit 41 in FIG. 3 is not in accordance with that of FIG. 4. With regard to the structure of the blanking aperture array mechanism 204, as shown in FIG. 3, a semiconductor substrate 31 made of silicon, etc. is placed on a support substrate 33. The central part of the substrate 31 is shaved from the back side, and made into a membrane region 330 (first region) having a thin film thickness h. The circumference surrounding the membrane region 330 is a circumferential region 332 (second region) having a thick film thickness H. The upper surface of the membrane region 330 and the upper surface of the circumferential region 332 are formed to be flush or substantially flush in height with each other. At the back side of the circumferential region 332, the substrate 31 is supported on the support substrate 33. The central part of the support substrate 33 is open, and the membrane region 330 is located at this opening region.

In the membrane region 330, passage holes 25 (openings) through each of which a corresponding one of multiple beams passes are formed at positions each corresponding to each hole 22 of the shaping aperture array substrate 203 shown in FIG. 2. In other words, in the substrate 31, there are formed a plurality of passage holes 25 in an array through each of which a corresponding beam of electron multiple beams passes. In the membrane region 330 of the substrate 31, as shown in FIGS. 3 and 4, each of a plurality of pairs (blanker: blanking deflector) each composed of the switching electrode 24 and the counter electrode 26 for blanking deflection is arranged close to a corresponding passage hole 25 in a manner such that the electrodes 24 and 26 are opposite each other across the passage hole 25 concerned. Moreover, close to each passage hole 25 and in the membrane region 330 in the direction of the film thickness, there is arranged the control circuit 41 (logic circuit) which switchably applies deflection voltage of binary values (positive electric potential Vdd and ground (GND) electric potential) to the switching electrode 24 for each passage hole 25. The counter electrode 26 for each beam is applied with a ground (GND) potential. Moreover, on the circumference of a plurality of passage holes 25 formed in the substrate 31, there are arranged a plurality of pads 43 for transmitting control signals including irradiation time data to a plurality of control circuits 41.

Although, in FIGS. 3 and 4, the number of the switching electrodes 24 is the same as that of the counter electrodes 26, it is not limited thereto. It is also preferable to arrange a common counter electrode 26 which is common to a plurality of switching electrodes 24 arrayed in the same row or column. Therefore, the composition ratio between a plurality of counter electrodes 26 and a plurality of switching electrodes 24 may be one-to-one or one-to-many.

As shown in FIG. 4, n-bit (e.g., 10-bit) parallel lines for control signals are connected to each control circuit 41. In addition to the n-bit parallel lines for controlling, clock signal lines and wiring lines for a power source are connected to each control circuit 41. A part of the parallel lines may be used as the clock signal lines and the power source wiring lines. An individual blanking mechanism 47 composed of the switching electrode 24, the counter electrode 26, and the control circuit 41 is configured for each of multiple beams. In the example of FIG. 3, the switching electrode 24, the counter electrode 26, and the control circuit 41 are arranged in the membrane region 330 having a thin film thickness of the substrate 31.

Each electron beam of the multiple beams 20 passing through a plurality of passage holes 25 is independently deflected by a potential difference applied to the two electrodes 24 and 26 being a pair. Blanking control is performed by this deflection. In other words, a pair of the switching electrode 24 and the counter electrode 26 individually provides blanking deflection of a corresponding one of the multiple beams having passed through a plurality of holes 22 (openings) of the shaping aperture array substrate 203.

Figure 5:
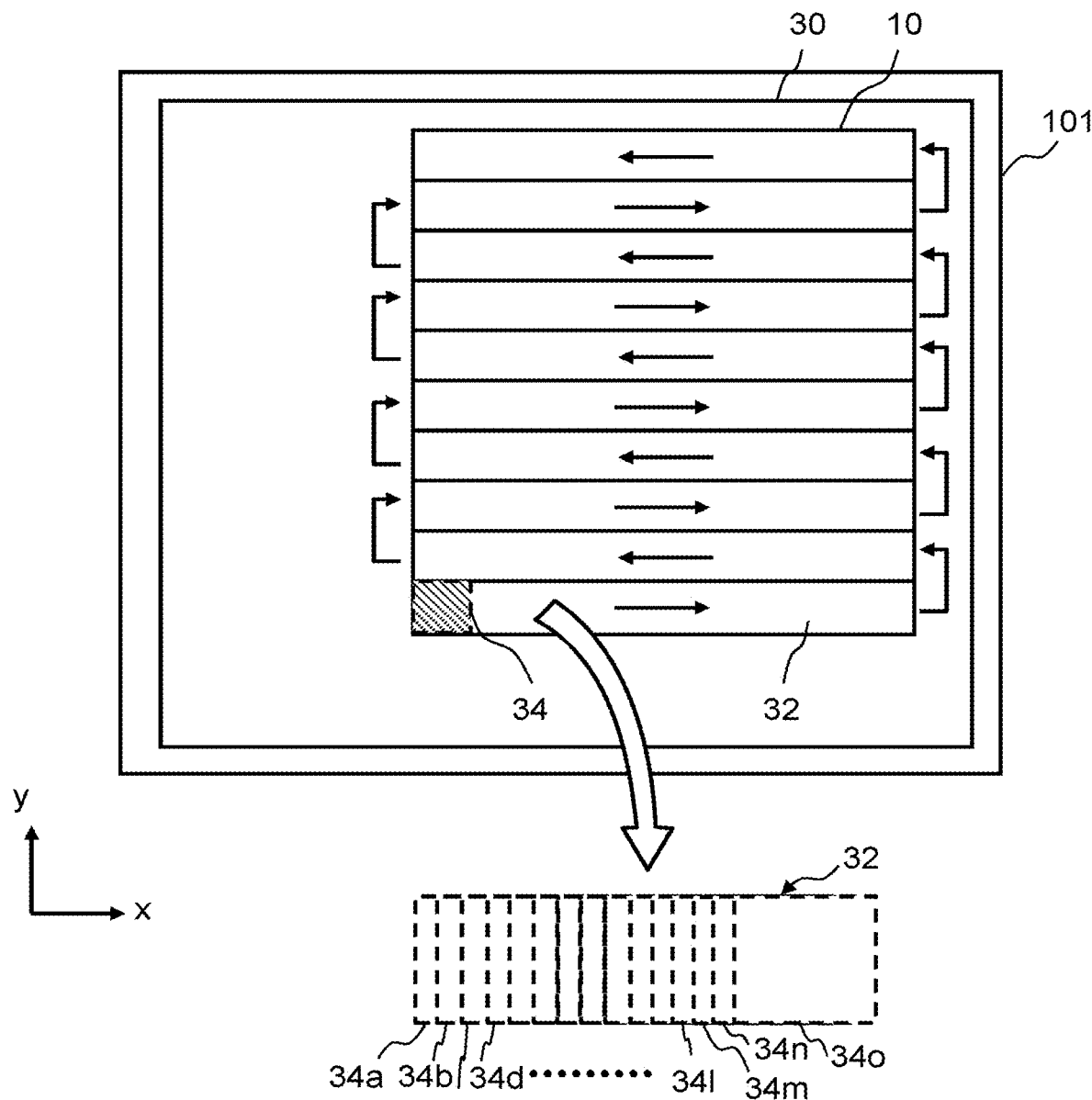
FIG. 5 is a conceptual diagram explaining an example of a writing operation according to the first embodiment.

FIG. 5 is a conceptual diagram explaining an example of a writing operation according to the first embodiment. As shown in FIG. 5, for example, a chip 10 is written in a writing region 30 of the target object 101. The region of the chip 10 is virtually divided by a predetermined width or "length" (to be a stripe width) in the y direction, for example, into a plurality of stripe regions 32 in a strip form. Each stripe region 32 serves as a unit region for writing. First, the XY stage 105 is moved to make an adjustment such that an irradiation region 34 which can be irradiated with one shot of the multiple beams 20 is located at the left end of the first stripe region 32 or at a position further left than the left end, and then writing is started. The irradiation region 34 can be defined by the region surrounded by the size in the x direction obtained by multiplying the pitch between beams in the x direction by the number of beams in the x direction, and the size in the y direction obtained by multiplying the pitch between beams in the y direction by the number of beams in the y direction. When writing the first stripe region 32, for example, the XY stage 105 is moved in the −x direction, and therefore, the writing advances such that the irradiation region 34 relatively moves in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position further right than the right end and located relatively in the y direction. Then, by moving the XY stage 105 in the x direction, for example, writing advances in the −x direction. That is, writing is performed while alternately changing the direction, such as performing writing in the x direction in the third stripe region 32, and in the −x direction in the fourth stripe region 32, thereby reducing the writing time. However, the writing operation is not limited to the writing while alternately changing the direction, and it is also preferable to perform writing in the same direction when writing each stripe region 32. A plurality of shot patterns up to as many as the number of the holes 22 are formed at a time by one shot of the multiple beams having been formed by passing through the respective holes 22 in the shaping aperture array substrate 203.

Writing processing is performed as described below. Specifically, the data processing unit 56 reads writing data from the storage device 140, and calculates the area density of a pattern arranged in each of a plurality of mesh regions obtained by virtually dividing each stripe region 32 into meshes. It is preferable that the size of the mesh region is, for example, a beam size, or smaller than the beam size. For example, the size of the mesh region is preferably about 10 nm. The data processing unit 56 reads, for each stripe region, corresponding writing data from the storage device 140, and assigns a plurality of figure patterns defined in the writing data to mesh regions, for example. Then, the area density of a figure pattern arranged in each mesh region is calculated.

Moreover, the data processing unit 56 calculates, for each predetermined sized mesh region, an irradiation time T (which hereinafter will also be called a shot time or an exposure time) of an electron beam per shot. When performing multiple writing, an irradiation time T of an electron beam per shot in each hierarchy (or "each writing process") of the multiple writing should be calculated. It is preferable to obtain an irradiation time T, which serves as a reference, to be in proportion to a calculated pattern area density. Moreover, it is preferable that an irradiation time T to be finally calculated is a time equivalent to a dose after correction which has been corrected with respect to a dimension change amount due to a phenomenon causing dimension variations, such as a proximity effect, a fogging effect, a loading effect, etc. (not shown). The size of a plurality of mesh regions to define the irradiation time T, and the size of a plurality of mesh regions to define the pattern area density may be the same size or different sizes. When they are different sizes, each irradiation time T may be calculated after interpolating an area density by linear interpolation, etc. The irradiation time T for each mesh region is defined in an irradiation time map which is to be stored in the storage device 142, for example.

Moreover, the data processing unit 56 converts the data on irradiation time of a corresponding beam into n-bit data, and generates irradiation time array data. The generated irradiation time array data is output to the deflection control circuit 130.

The deflection control circuit 130 outputs, for each shot, irradiation time array data to each control circuit 41.

In a writing step, under the control of the writing control unit 58, the writing mechanism 150 performs writing, for each beam shot, based on the irradiation time concerned. Specifically, it operates as described below.

The electron beam 200 emitted at a predetermined acceleration voltage (e.g., 10 to 100 keV) from the electron gun 201 (emitter) almost perpendicularly (vertically) illuminates the whole of the shaping aperture array substrate 203 by the illumination lens 202. In the shaping aperture array substrate 203, a plurality of quadrangular (rectangular) holes (openings) are formed. The region including all the plurality of holes is irradiated by the electron beam 200. For example, a plurality of quadrangular electron beams (multiple beams) 20a to 20e are formed by letting portions of the electron beam 200, which irradiate the positions of a plurality of holes 22, individually pass through a corresponding one of the plurality of holes 22 of the shaping aperture array substrate 203. The multiple beams (multi-beams) 20a to 20e individually pass through corresponding blankers (first deflector: individual blanking mechanism) of the blanking aperture array mechanism 204. Each blanker deflects (provides blanking deflection) the electron beam 20 individually passing.

The multiple beams 20a to 20e having passed through the shaping aperture array substrate 203 and the blanking aperture array mechanism 204 irradiate the target object 101 by the electron optical system. Specifically, it operates as described below. The multiple beams 20a to 20e having passed through the blanking aperture array mechanism 204 are reduced by the reducing lens 205, and go toward the hole in the center of the limiting aperture substrate 206. At this stage, the electron beam 20a which was deflected by the blanker of the blanking aperture array mechanism 204 deviates from the hole in the center of the limiting aperture substrate 206 and is blocked by the limiting aperture substrate 206. On the other hand, the electron beams 20b to 20e which were not deflected by the blanker of the blanking aperture array mechanism 204 pass through the hole in the center of the limiting aperture substrate 206 as shown in FIG. 1. Blanking control is provided by ON/OFF of the individual blanking mechanism 47 so as to control ON/OFF of beams. Thus, the limiting aperture substrate 206 blocks each beam which was deflected to be in the OFF state by the individual blanking mechanism 47. Then, one shot beam is formed by a beam which has been made during a period from becoming "beam ON" to becoming "beam OFF" and has passed through the limiting aperture substrate 206. The multiple beams 20 having passed through the limiting aperture substrate 206 are focused by the objective lens 207 so as to be a pattern image of a desired reduction ratio. The respective beams (the whole of the multiple beams 20) having passed through the limiting aperture substrate 206 are collectively deflected in the same direction by the deflector 208 in order to irradiate respective beam irradiation positions on the target object 101. For example, while the XY stage 105 continuously moves, controlling is performed by the deflector 208 so that the irradiation positions of the beams may follow the movement of the XY stage 105. The position of the XY stage 105 is measured by way of radiating a laser from the stage position detector 139 to the mirror 210 on the XY stage 105 in order to use its reflected light for measurement. Ideally, the multiple beams 20 irradiating at a time are aligned at pitches obtained by multiplying the arrangement pitch of a plurality of holes 22 of the shaping aperture array substrate 203 by a desired reduction ratio described above. The writing apparatus 100 sequentially performs writing of the mesh regions (pixels) described above by using multiple beams while relatively moving the irradiation region 34 in the x direction. When a desired pattern is written, beams necessary according to the pattern is controlled to be ON by blanking control.

For highly precisely writing a pattern by using the multiple beams 20, the irradiation position of each beam configuring the multiple beams 20 needs to be individually ascertained (grasped). However, as described above, it is not easy to individually detect each beam one by one while excluding other beams. For example, in the case of scanning a transmission mark with the entire multiple beams 20, it has been examined to use a transmission mark made by opening one minute hole in heavy metal as thick as possible. The reason for this is that transmission (penetration) of beams other than the detection target beam can be blocked by using the heavy metal, and therefore, sufficient contrast can be acquired between the beam to be detected and the other beams. However, in thick heavy metal, heat dissipates readily due to the structure. Therefore, heat generated by irradiation of the multiple beams is radiated, and the minute hole is closed with adhering contaminants in a short period of time. Then, in the first embodiment, the individual beam detector 106 of a transmission mark type is offered which can prevent the minute hole from being closed by adhesive contaminants.

Figure 6:
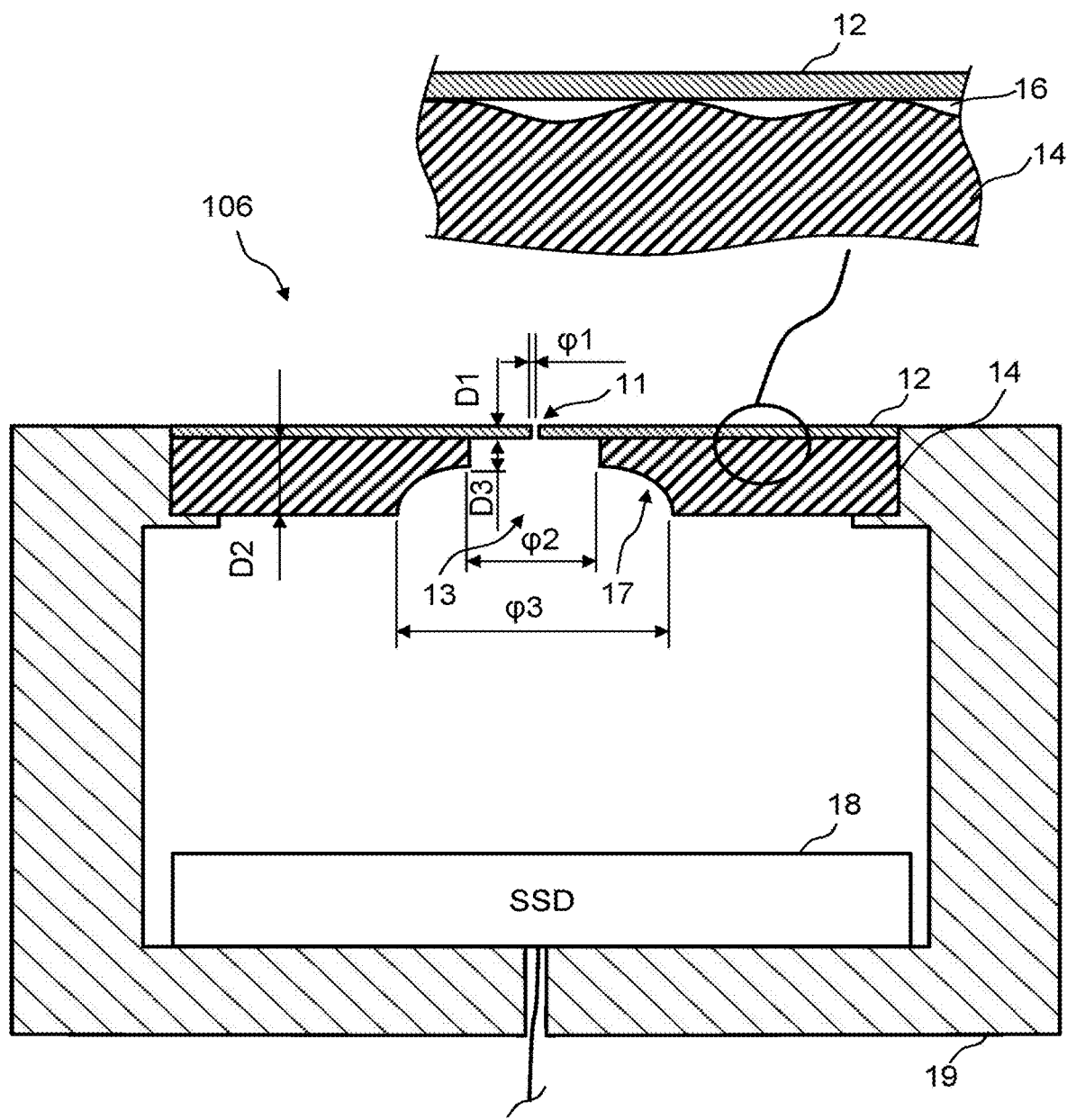
FIG. 6 is a sectional view of a structure of an individual beam detector of a transmission mark type according to the first embodiment.

FIG. 6 is a sectional view of a structure of an individual beam detector of a transmission mark type according to the first embodiment. In FIG. 6, the individual beam detector 106 of a transmission mark type of the first embodiment includes a mark substrate 12 (thin film), a support base 14, a sensor 18, and a housing 19.

In the center of the mark substrate 12 (thin film), there is formed one minute hole 11 (passage hole). The mark substrate 12 is formed by a thin film which multiple beams can penetrate (transmit) through. Specifically, the mark substrate 12 is formed by a thin film plate having a thickness D1 of 300 to 1000 nm, made of heavy metal, and more preferably, the thickness D1 is about 500 nm±50 nm. For example, an electron beam emitted by an acceleration voltage of 50 keV is too large to be absorbed by the film thickness D1, and thus, it penetrates the film thickness D1. When the mark substrate 12 is heated, heat transfer from the heated position to the circumference can be difficult by making the mark substrate 12 have a thin-film structure, thereby reducing the heat dissipation. As the heavy metal material, platinum (Pt), gold (Au), or tungsten (W) is preferably used, for example. Even when the film thickness is made thin, since the heavy metal is used, the electron transmission amount in the case of irradiation of the multiple beams 20 can be reduced. The diameter size φ1 of the minute hole 11 (passage hole) is formed to be larger than the diameter of each beam of the multiple beams 20 each being an electron beam, and smaller than the pitch between the beams. For example, when the pitch between beams of the multiple beams 20 is about 150 to 200 nm, the hole is formed to have a diameter φ1 of about 80 to 120 nm. In the example of FIG. 6, the hole is formed to be a circle having a 100 nm diameter. By making the diameter of the minute hole 11 larger than the beam diameter and smaller than the pitch between the beams, even when scanning is performed using the multiple beams 20, it is possible to prevent a plurality of beams from simultaneously passing through the minute hole 11. The mark substrate 12 is supported by the support base 14.

In the support base 14, there is formed an opening 13 under the region of the mark substrate 12 (thin film) including the minute hole 11. In the case of FIG. 6, the opening 13 is formed at the center. The diameter size φ2 (width size) of the opening 13 is formed such that, when the mark substrate 12 is irradiated with the multiple beams 20, the temperature of the periphery of the minute hole 11 in the mark substrate 12 is higher than the evaporation temperature of the impurities (contaminants) adhering to the periphery. As the evaporation temperature of the contaminants, it is preferably 100° C. or more, for example. As the material of the support base 14, molybdenum (Mo), platinum (Pt), tantalum (Ta), or silicon (Si) is preferably used, for example. The thickness D3 of the support base 14 is formed to be thick enough to block the electron beam, which is to be the irradiating multiple beams 20, not to penetrate the thickness. For example, the thickness D3 is preferably set to 15 μm or more. For example, the thickness is set to be 1 mm. As long as this thickness is kept, the electron beam accelerated by 50 keV, for example, can be blocked.

Figure 7:
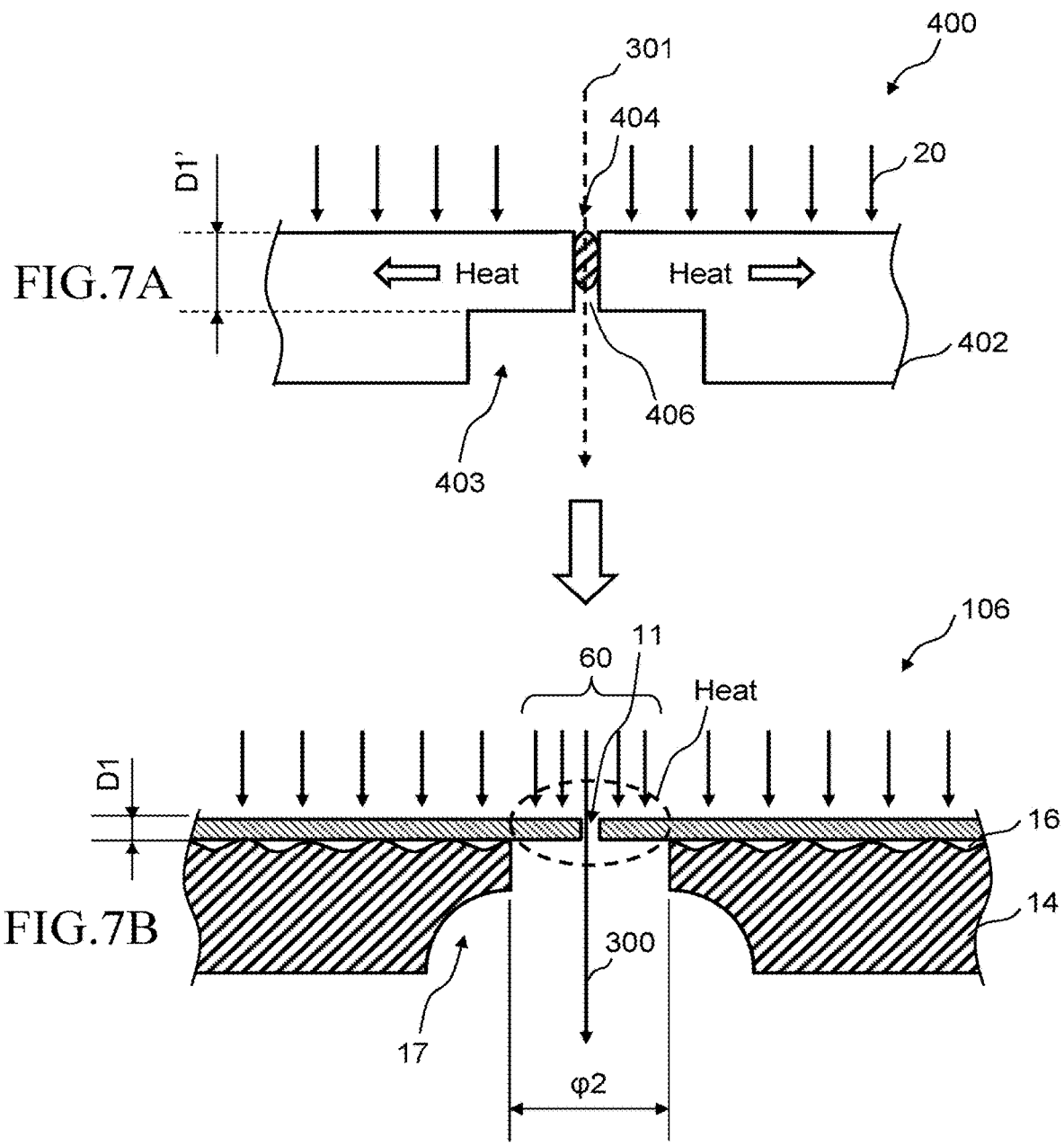
FIGS. 7A and 7B illustrate states of heat transfer according to the first embodiment and a comparative example.

FIGS. 7A and 7B illustrate states of heat transfer according to the first embodiment and a comparative example. As a comparative example, FIG. 7A shows the case of an integrated monolithic transmission mark 400 where an opening 403 is formed from the backside to the middle of the film thickness of a substrate 402 made of a heavy metal material, and a passage hole 404 whose diameter is smaller than the pitch between beams is formed in the center of the opening 403. Although the thickness D1' of the substrate 402 has become thin due to the formation of the opening 403, it is set to be thick enough impenetrable by electron beams. When scanning the transmission mark 400 with the multiple beams 200, only one beam 301 whose irradiation position is in accordance with the position of the passage hole 404 can pass through the substrate 402, but other beams are blocked not to pass therethrough. Then, since the other beams irradiate the circumference of the passage hole 404, the substrate 402 is heated, and the heat dissipates horizontally in the substrate 402 having the thickness D1' impenetrable by electron beams. Therefore, the temperature of the substrate 402 does not increase to the one high enough to remove contaminants. As a result, contaminants 406 adhere to and close the passage hole 404 being a minute hole. On the other hand, according to the first embodiment, the thin-film mark substrate 12 and the support base 14 are intentionally separated from each other as different parts as shown in FIG. 7B, which is not the monolithic integrated structure, such as where an opening is formed from the backside to the middle of the film thickness of a heavy metal material and a passage hole is formed in the center of the opening. Moreover, the backside of the mark substrate 12 and the top face (surface) of the support base 14 are not perfectly flat (mirror finish) intentionally. Therefore, for example, there is a mild roughness (unevenness) on the backside of the mark substrate 12 and/or the upper surface of the support base 14. Thus, when supporting the backside of the mark substrate 12 by the upper surface of the support base 14, not a point contact but a surface contact can exist substantially between the mark substrate 12 and the support base 14 due to the unevenness. Therefore, there is formed an aperture 16 between the mark substrate 12 and the support base 14. The aperture 16 forms a heat-insulating layer. This makes it possible that the heat due to the multiple beams 20 irradiating the mark substrate 12 is difficult to be transferred to the support base 14 side. However, this state is not sufficient to maintain the peripheral temperature of the minute hole 11 to be enough for removing contaminants. Then, according to the first embodiment, an adjustment is made to the diameter φ2 of the opening 13 under the region including the minute hole 11. If the diameter φ2 is increased, it becomes difficult to transfer the heat around the minute hole 11 to the support base 14, thereby suppressing decrease of the temperature. In contrast, if the diameter φ2 is reduced, the heat around the minute hole 11 decreases because of being transferred to the support base 14 side.

According to the first embodiment, first, experiments are performed to investigate (search for) the diameter size φ2 of the opening 13 under which the temperature of the periphery of the minute hole 11 is higher than the evaporation temperature of the impurities (contaminants) adhering to the periphery when the mark substrate 12 is irradiated with the multiple beams 20. As a result, for example, it was found that the diameter of an irradiation region in the case of being irradiated with about three thousand beams each having a current amount of 1 pA to 2 pA is suitable for the diameter size φ2. Then, according to the first embodiment, the opening 13 is formed such that its width size is equal to or greater than the lower limit value of the diameter size φ2 (width size) which brings the temperature of the periphery of the minute hole 11 (passage hole) higher than the evaporation temperature (e.g., 100° C.) of impurities (contaminants) adhering to the periphery, and also its width size is within a predetermined margin of the lower limit value. As the predetermined margin, it is preferable to be, for example, equal to or lower than 30% of the lower limit value of the diameter size φ2 (width size). More preferably, it is to be equal to or lower than 25% of the lower limit value. In the first embodiment, it is preferable that the diameter size φ2 of the opening 13 is set to 8 to 10 μm.

Moreover, by preparing an opening 17 which is formed by scraping (shaving) the periphery of the opening 13 at the backside of the support base 14 as much as possible while keeping the thickness D3 impenetrable by electrons, it becomes difficult for the heat transferred from the mark substrate 12 to the support base 14 near the periphery of the opening 13 to transmit in the horizontal direction. Consequently, it is possible to suppress the decrease of the temperature of a region 62 near the minute hole 11 of the mark substrate 12 on the opening 13.

As described above, according to the first embodiment, the temperature of the periphery of the minute hole 11 is controlled by the diameter size φ2 (width size) of the opening 13, which does not support the mark substrate 12, formed in the support base 14 supporting the mark substrate 12 (thin film). After determining the diameter size φ2 (width size) of the opening 13 of the support base 14 in order that the periphery of the minute hole 11 can maintain a temperature higher than the evaporation temperature of impurities (contaminants), next, the height position of the sensor 18 for detecting one beam which passes through the minute hole 11 is set.

Figure 8:
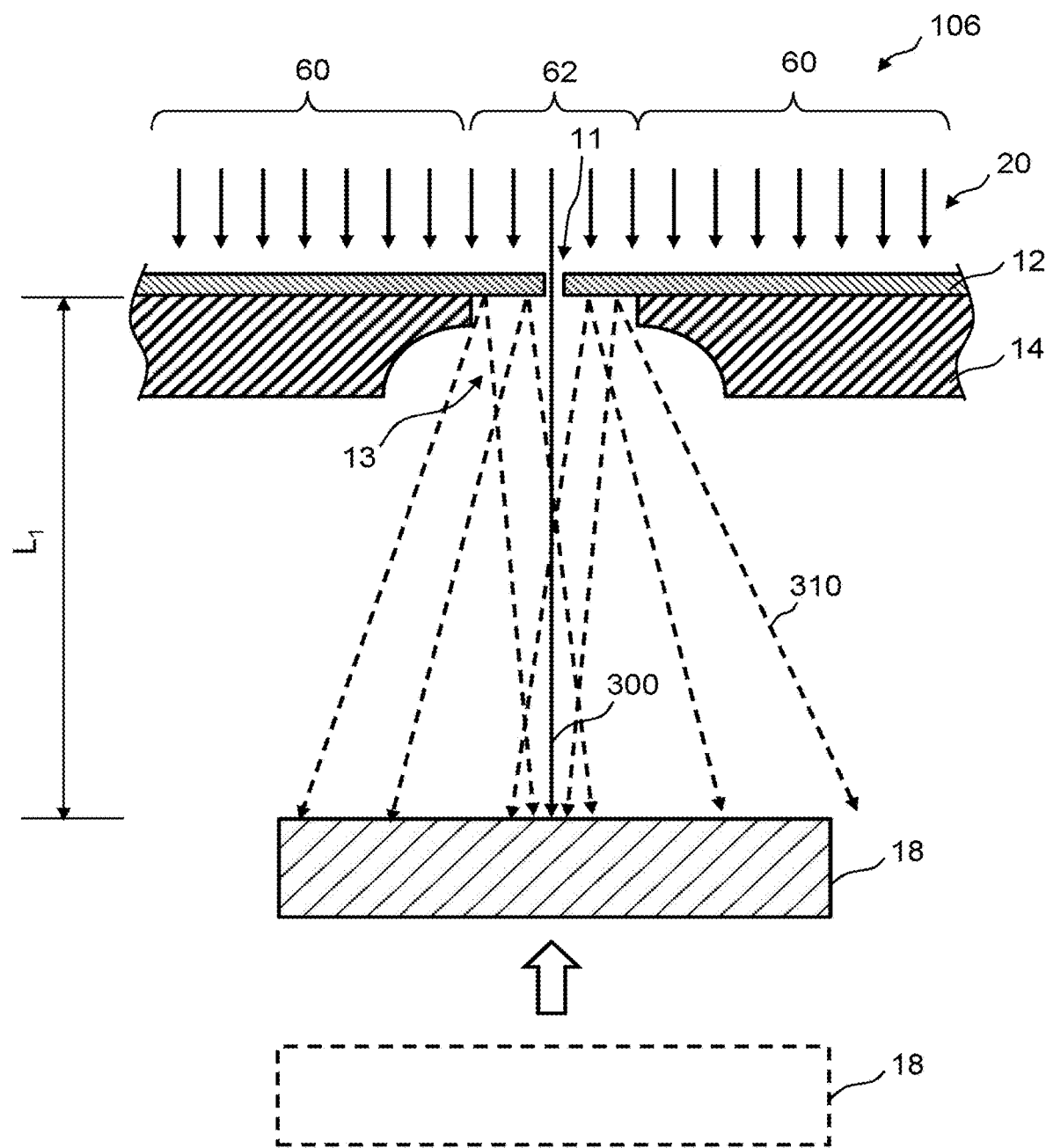
FIG. 8 shows a situation example of a beam to be measured and a beam to penetrate a thin film in an individual beam detector according to the first embodiment.

FIG. 8 shows a situation example of a beam to be measured and a beam to penetrate (transmit) a thin film in an individual beam detector according to the first embodiment. In FIG. 8, the surface of the mark substrate 12 is irradiated with the multiple beams 20. With respect to beams, in the multiple beams 20, irradiating the region 62 above the opening 13, an object beam 300 passes through the minute hole 11 to make an advance. The rest beams 310 penetrate the mark substrate 12 and scatter from the backside of the mark substrate 12. On the other hand, beams, in the multiple beams 20, irradiating the regions 60 of the mark substrate 12 which are other than the region 62 above the opening 13 are blocked by the support base 14. If the number of the beams 310 having penetrated the mark substrate 12 so as to reach the light receiving surface of the sensor 18 is too large, since the object beam 300 cannot acquire contrast to the rest beams, it becomes difficult to detect the object beam 300. Therefore, according to the first embodiment, when scanning the surface of the mark substrate 12 with the multiple beams 20, the sensor 18 is arranged at the position away from the mark substrate 12 by a distance L1 based on which one detection target beam having passed through the minute hole 11 of the mark substrate 12 can be detected by the sensor 18 as a detection value which has contrast discernible from the beams 310 which have penetrated the mark substrate 12 and are passing through the opening 13 without being blocked by the support base 14.

Figure 9A:
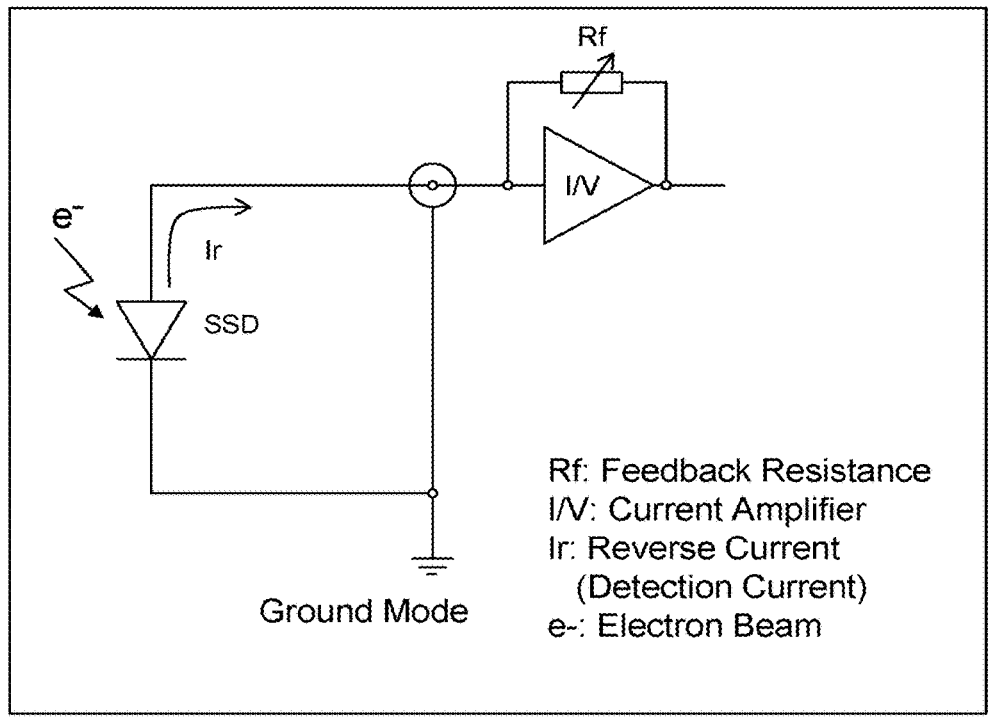
FIGS. 9A and 9B illustrate detection circuits of the individual beam detector according to the first embodiment.
Figure 9B:
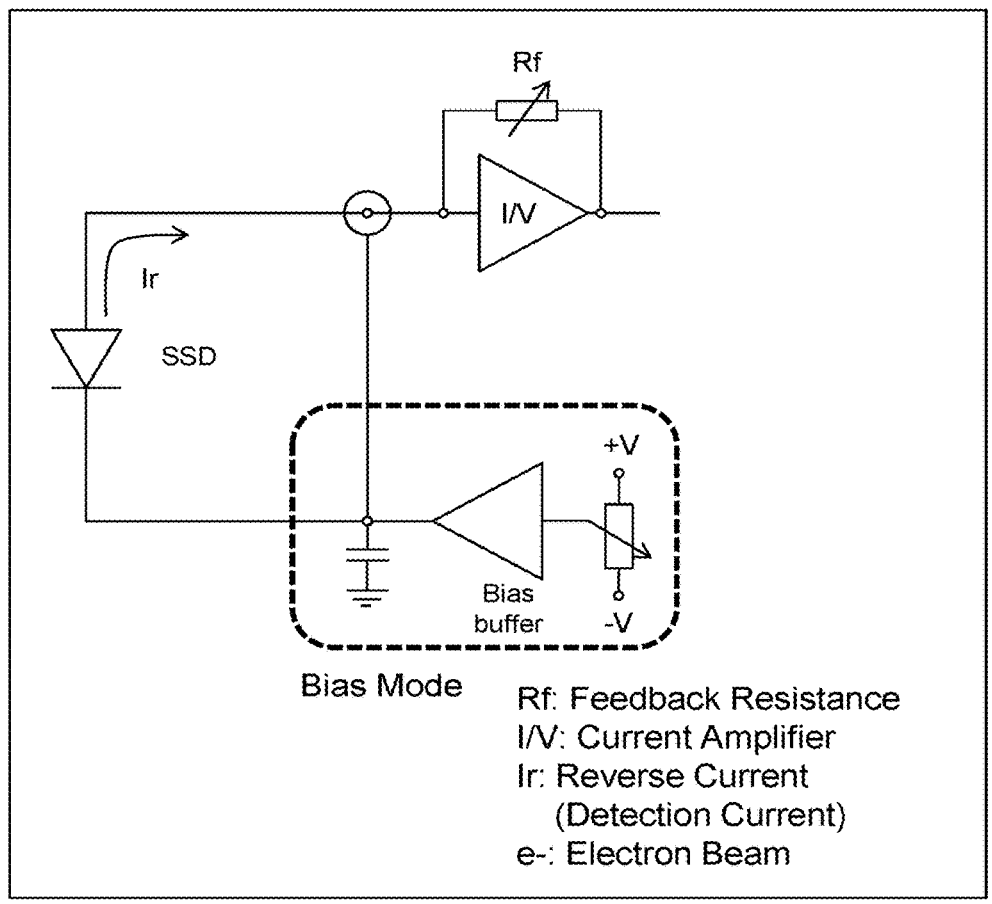

FIGS. 9A and 9B illustrate detection circuits of the individual beam detector according to the first embodiment. Here, the term "discernible" of "discernible contrast" does not just mean a difference between background and signal, but it means that, in a detection circuit shown in FIG. 9A, for example, offset falls within the dynamic range so that a detected signal may fall in the output range of the sensor 18 and in the input range of the amplifier, and a signal greater than or equal to the resolution can be obtained.

If the distance between the mark substrate 12 and the sensor 18 is far, the number of the penetrating beams 310 received by the sensor 18 can be lessened because the beams 310 having penetrated are scattered. However, if the distance increases, the size in the height-wise direction (z direction) of the individual beam detector 106 itself increases with the amount of the distance increase. For detecting an individual beam configuring the multiple beams 20 at the same height position as the surface of the target object 101 on the XY stage 105, if the size in the height-wise direction (z direction) of the individual beam detector 106 itself increases too much, it becomes impossible to arrange the mark substrate 12 on the XY stage 105, and arrange the sensor 18 inside a concave portion formed in the XY stage 105 or on the lower surface of the XY stage 105 after forming a through-hole in the XY stage 105. In the above case, it is necessary to independently provide the sensor 18 on the bottom of the writing chamber 103 so that detection can be performed through a through-hole formed in the XY stage 105. In that case, a drive system for making the sensor 18 follow the mark substrate 12 also needs to be provided separately.

Then, according to the first embodiment, the distance L1 from the mark substrate 12 to the light receiving surface of the sensor 18 is set such that the distance from the mark substrate 12 is equal to or greater than the lower limit value of a distance based on which the detection target beam 300 can be detected by the sensor 18 as a detection value with contrast discernible from the penetrating beams 310, and is equal to or less than the upper limit value (that is, equal to or less than the distance between the upper and lower surfaces of the XY stage 105) of distance where the sensor 18 can be attached to the XY stage 105. For example, it is preferable that the distance L1 from the mark substrate 12 to the light receiving surface of the sensor 18 is set to 8 to 24 mm. More preferably, the distance L1 from the mark substrate 12 to the light receiving surface of the sensor 18 is set to 10 to 15 mm. As the sensor 18, it is preferable to use an SSD (solid state drive) detector, but it is not necessarily limited to the SSD. For example, a photomultiplier tube or a Faraday cup may also be used as the sensor 18.

As shown in FIG. 9A, by configuring the detection circuit such that the sensor 18 and the amplifier are connected in the ground as a ground mode and by applying an offset, a discernible contrast can be acquired. Alternatively, as shown in FIG. 9B, noise can be reduced by configuring a detection circuit such that the sensor 18 is connected to the amplifier, and the sensor 18 and the amplifier are connected to a bias circuit, as a bias mode, and forming a bias buffer by the bias circuit.

The perimeter size of the support base 14 is formed to be equal to or larger than that of the mark substrate 12, for example. The bottom of the support base 14 is supported by the housing 19. Preferably, the space between the backside of the mark substrate 12 and the light receiving surface of the sensor 18 is substantially surrounded by the housing 19. This prevents the scattered electrons, which may be an obstacle in increasing contrast, from intruding from the outside. According to the first embodiment, the sensor 18 is arranged without any intervening blocking object in the space between the sensor 18 and the region at the backside of the mark substrate 12 exposed by the opening 13. Although it is also possible to restrict the number of the beams 310, which have penetrated to reach the sensor 18 by arranging a limiting aperture above the sensor 18, if such a limiting aperture is arranged, it becomes necessary to perform a position alignment for the limiting aperture. According to the first embodiment, the distance L1 from the mark substrate 12 to the light receiving surface of the sensor 18 can be sufficiently lessened even if not arranging the limiting aperture. Therefore, the time and effort in position alignment to arrange the limiting aperture can be made unnecessary.

Figure 10:
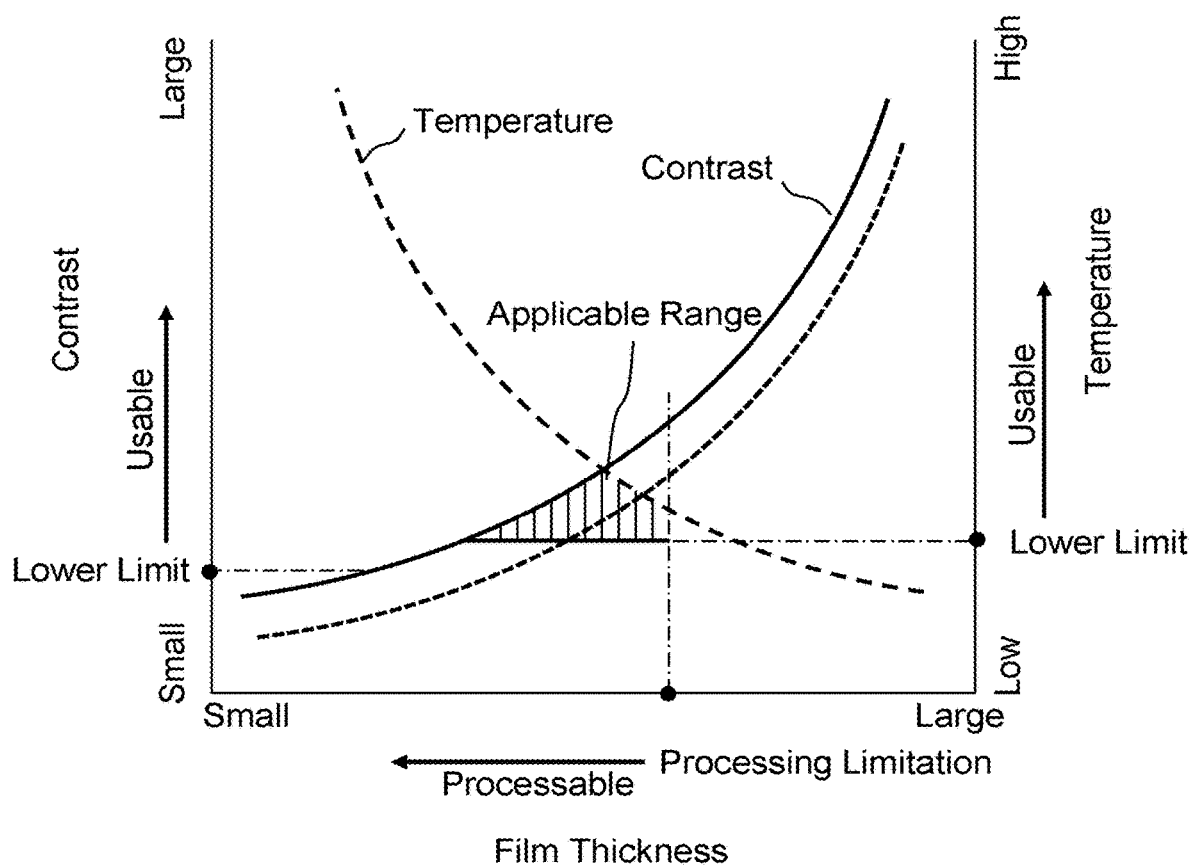
FIG. 10 illustrates an applicable range of the individual beam detector according to the first embodiment.

FIG. 10 illustrates an applicable range of the individual beam detector according to the first embodiment. In FIG. 10, the left ordinate axis represents the contrast, and the right ordinate axis represents the temperature. The abscissa axis represents the film thickness D1 of the mark substrate 12. If the film thickness D1 of the mark substrate 12 decreases, the number of the penetrating beams 310 increases depending upon the decrease, and thus, contrast of the detection target beam 300 falls. On the other hand, if the film thickness D1 of the mark substrate 12 increases, the heat raised due to irradiation of the multiple beams 20 dissipates horizontally depending upon the increase, and thus, the temperature of the periphery of the minute hole 11 falls. Therefore, it is necessary to set the film thickness D1 of the mark substrate 12 within the range which makes the contrast be the lower limit value or more for obtaining a required contrast. Simultaneously, it is necessary to set the film thickness D1 of the mark substrate 12 within the range which makes the temperature be the lower limit or more of a required temperature. Furthermore, if the film thickness D1 of the mark substrate 12 becomes too large against the size of the minute hole 11 of a required size, it results in difficulty in maintaining the processing accuracy. Therefore, the aspect ratio should not be too large. Accordingly, the film thickness D1 of the mark substrate 12 needs to be equal to or less than the value of processing limitation for processing the minute hole 11 of a required size. Thus, the range surrounded by these conditions is the applicable range of the film thickness D1 of the mark substrate 12. It should be understood that if the distance L1 from the mark substrate 12 to the light receiving surface of the sensor 18 changes, the value of the graph showing contrast also changes.

As described above, the individual beam detector 106 of the first embodiment is formed such that the temperature higher than the evaporation temperature of impurities (contaminants) can be maintained at the periphery of the minute hole 11, its height size can be a size making the detection target beam 300 be detected by the sensor 18 as a detection value having contrast discernible from the penetrating beams 310 and can be arranged on the XY stage 105. An individual beam of the multiple beams 20 is detected using this individual beam detector 106.

Figure 11A:
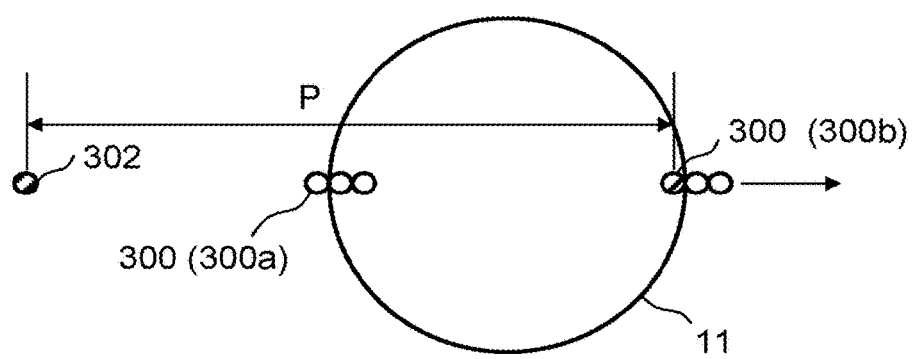
FIGS. 11A and 11B illustrate an individual beam detection method according to the first embodiment.
Figure 11B:
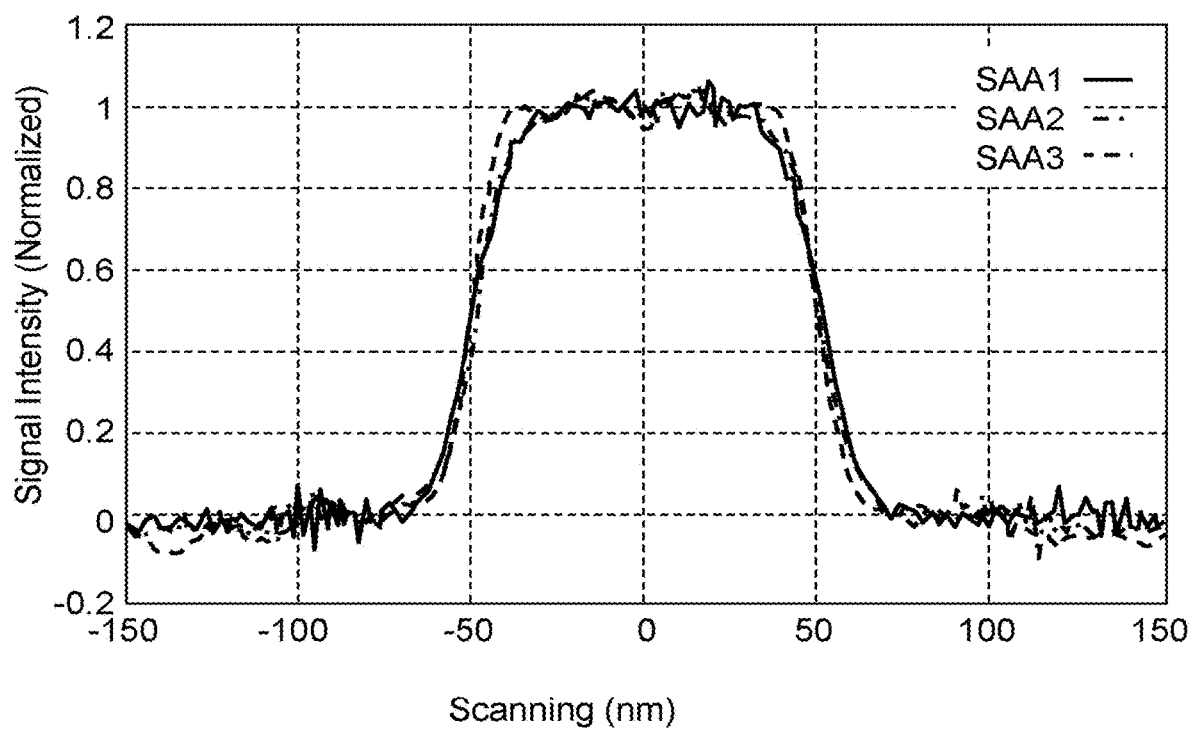

FIGS. 11A and 11B illustrate an individual beam detection method according to the first embodiment. FIG. 11A shows two beams 300 and 302 aligned in the scanning direction of the multiple beams 20. In FIG. 11A, the distance between the two adjacent beams 300 and 302 is a beam pitch P between beams of the multiple beams 20.

In a scanning step, while maintaining the temperature of the periphery of the minute hole 11 in the mark substrate 12 to be higher than the evaporation temperature of the impurities adhering to the periphery, the multiple beams 20 scan the mark substrate 12. In other words, the thin film in which there is formed a passage hole smaller than the pitch between beams of the multiple beams 20 and larger than the beam diameter is irradiated with the multiple beams 20. By this operation, the detection target beam 300 shown in FIG. 11A gradually approaches the minute hole 11 in the mark substrate 12, and reaches the minute hole 11 (state of beam 300a). Along the scanning direction, the beam 300 passes over the minute hole 11. Then, after further scanning, the beam 300 reaches the final position of the periphery of the minute hole 11 (state of beam 300b). Then, the beam 300 exceeds (goes over) the minute hole 11. The beam 300 which is just passing over the minute hole 11 along the scanning direction passes through the minute hole 11 and goes to the sensor 18. In such a case, since the minute hole 11 is formed in the mark substrate 12 (thin film) to have a size smaller than the pitch P between beams of the multiple beams each being an electron beam, the adjacent beam 302 never passes through the minute hole 11 together with the beam 300. Thus, the minute hole 11 makes the one beam 300 in the multiple beams 20 pass therethrough. In this case, simultaneously, beams around the beam 300 having passed through the minute hole 11 are made to penetrate (transmit) the mark substrate 12.

In a detection step, the sensor 18 detects the one beam 300 which has passed through the minute hole 11. In other words, detection of the one beam 300 having passed through the minute hole 11 (passage hole) is performed by the sensor located away from the thin film by a distance based on which the one beam 300 (detection target beam) having passed through the minute hole 11 can be detected by the sensor 18 as a detection value with contrast discernible from the beams having penetrated the mark substrate 12. Although beams around the beam 300 penetrate the mark substrate 12 in the region above the opening 13 of the support base 14 at the periphery of the minute hole 11, the individual beam detector 106 of the first embodiment can acquire signal intensity of contrast based on which the detection target beam 300 can be sufficiently detected as shown in FIG. 11B even if the penetrating beams exist. FIG. 11B shows examples of results measured by three shaping aperture array substrates 203 (SAA 1 to 3) each forming the multiple beams 20.

Since the individual beam detector 106 of the first embodiment maintains a temperature higher than the evaporation temperature of impurities (contaminants), detection of the position of each of the multiple beams 20 can be completed in the state where the minute hole 11 is not closed with contaminants.

Figure 12:
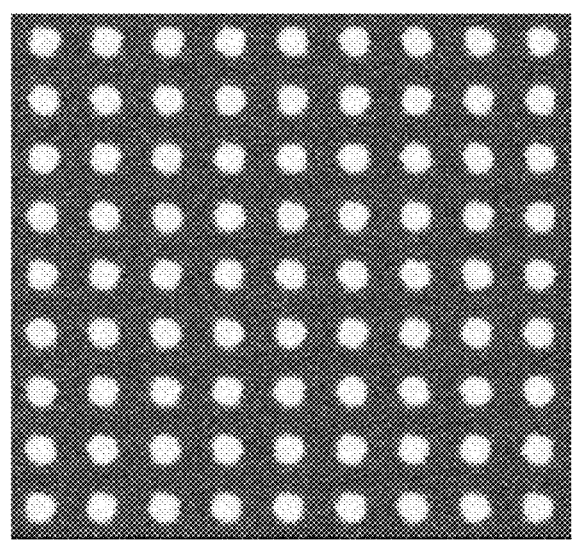
FIG. 12 shows an example of an image obtained by detecting multiple beams according to the first embodiment.

FIG. 12 shows an example of an image obtained by detecting multiple beams according to the first embodiment. In FIG. 12, detected images of a part (9×9 beams) of the multiple beams 20 are shown. Each beam is detected by the size φ1 of the minute hole 11. In the individual beam detector 106 according to the first embodiment, the minute hole 11 is formed in the mark substrate 12 (thin film) to be larger than the diameter of each beam of multiple beams each being an electron beam, and smaller than the pitch P between the beams, each beam can be discerned as shown in FIG. 12.

Figure 13A:
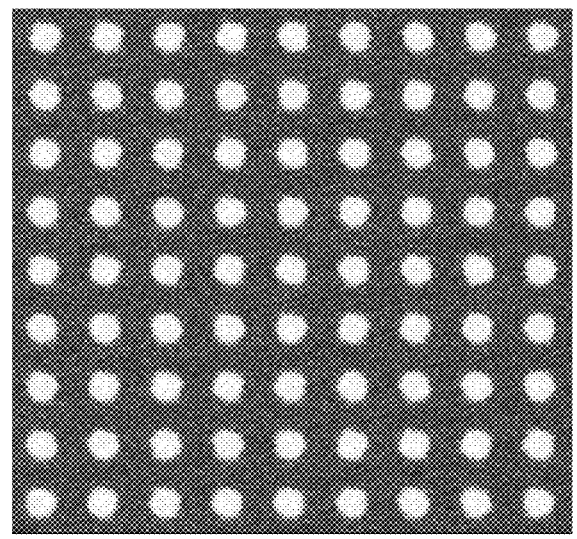
FIGS. 13A and 13B illustrate a method of measuring the position of multiple beams according to the first embodiment.
Figure 13B:
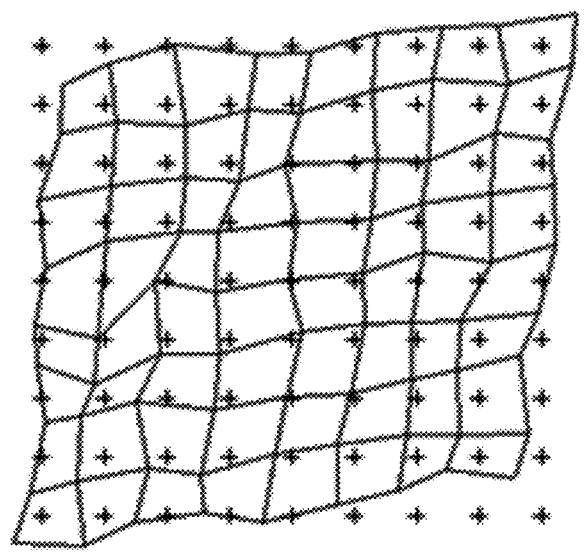

FIGS. 13A and 13B illustrate a method of measuring the position of multiple beams according to the first embodiment. In FIG. 13A, similarly to FIG. 12, detected images of a part (9×9 beams) of the multiple beams 20 are shown. By measuring (calculating) the center position of each beam of the detected image shown in FIG. 13A, and connecting adjacent measured positions with each other by a straight line, a position map (position deviation map) of each of beams in a grid can be generated as shown in FIG. 13B.

Moreover, in the individual beam detector 106 according to the first embodiment, beam intensity can be measured individually, which thus can also be utilized for measuring the focus position of each beam, measuring astigmatism, etc.

As described above, according to the first embodiment, it is possible to provide an individual beam detector for multiple beams which can avoid being closed with impurities in a short period of time.

Embodiments have been explained referring to specific examples described above. However, the present invention is not limited to these specific examples. For example, the number of passage holes formed in the thin film is not limited to one, but may be two or more.

While the apparatus configuration, control method, and the like not directly necessary for explaining the present invention are not described, some or all of them can be selectively used on a case-by-case basis when needed. For example, although description of the configuration of the control system for controlling the writing apparatus 100 is omitted, it should be understood that some or all of the configuration of the control system can be selected and used appropriately when necessary.

In addition, any other blanking apparatus for multiple charged particle beams, blanking method for multiple charged particle beams, and a multi charged particle beam writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An individual beam detector for multiple beams comprising:
   a thin film configured in which a passage hole smaller than a pitch between beams of multiple beams each being an electron beam and larger than a diameter of a beam of the multiple beams is formed, and through which the multiple beams can penetrate;
   a support base configured to support the thin film, in which an opening is formed under a region including the passage hole in the thin film, and a width size of the opening is formed to have a temperature of a periphery of the passage hole in the thin film higher than an evaporation temperature of impurities adhering to the periphery in a case that the thin film is irradiated with the multiple beams; and
   a sensor arranged, in a case where a surface of the thin film is scanned with the multiple beams, at a position away from the thin film by a distance based on which a detection target beam having passed through the passage hole of the thin film can be detected by the sensor as a detection value with contrast discernible from beams which have penetrated the thin film and are passing the opening without being blocked by the support base.

2. The individual beam detector according to claim 1, wherein a heat-insulating layer is formed between the thin film and the support base.

3. The individual beam detector according to claim 1, wherein the sensor is arranged at the position without any intervening blocking object in a space between the sensor and a region at a backside of the thin film exposed by the opening.

4. The individual beam detector according to claim 3, wherein the opening is formed such that its width size is equal to or greater than a lower limit value of a width size under which the temperature of the periphery of the passage hole is higher than the evaporation temperature of the impurities adhering to the periphery, and also its width size is within a predetermined margin of the lower limit value.

5. The individual beam detector according to claim 4, wherein the predetermined margin is set to be equal to or lower than 30% of the lower limit value of the width size.

6. The individual beam detector according to claim 4, wherein
   the multiple beams irradiate a target object placed on a stage, and
   the sensor is arranged such that the distance from the thin film is equal to or greater than a lower limit value of a distance, based on which the detection target beam can be detected by the sensor as the detection value with the contrast discernible from the beams having penetrated through, and equal to or less than an upper limit value of a distance where the sensor can be attached to the stage.

7. The individual beam detector according to claim 1, wherein the sensor is connected to an amplifier, and grounded with the amplifier.

8. The individual beam detector according to claim 1, wherein the sensor is connected to an amplifier, and connected to a bias circuit with the amplifier.

9. A multi-beam irradiation apparatus comprising:
   a stage configured to mount thereon a target object;
   an emission source configured to emit an electron beam;
   a shaping aperture array substrate configured to form multiple beams by being irradiated with the electron beam, and making portions of the electron beam individually pass therethrough;
   an electron optical system configured to irradiate the target object with the multiple beams; and
   an individual beam detector to be arranged on the stage and to individually detect each beam of the multiple beams, the individual beam detector including:

a thin film in which a passage hole smaller than a pitch between beams of the multiple beams each being the electron beam and larger than a diameter of a beam of the multiple beams is formed, and through which the multiple beams can penetrate, a support base to support the thin film, in which an opening is formed under a region including the passage hole in the thin film, and a width size of the opening is formed to have a temperature of a periphery of the passage hole in the thin film higher than an evaporation temperature of impurities adhering to the periphery in a case that the thin film is irradiated with the multiple beams, and a sensor arranged, in a case where the thin film is scanned with the multiple beams, at a position away from the thin film by a distance based on which a detection target beam having passed through the passage hole of the thin film can be detected by the sensor as a detection value with contrast discernible from beams which have penetrated the thin film and are passing the opening without being blocked by the support base.

10. The apparatus according to claim 9, wherein the sensor is arranged such that the distance from the thin film is equal to or greater than a lower limit value of a distance, based on which the detection target beam can be detected by the sensor as the detection value with the contrast discernible from the beams having penetrated the thin film, and equal to or less than an upper limit value of a distance where the sensor can be attached to the stage.

11. An individual beam detection method comprising:

irradiating, with multiple beams each being an electron beam, a thin film in which a passage hole smaller than a pitch between beams of the multiple beams and larger than a diameter of a beam of the multiple beams is formed;

making a beam of the multiple beams pass through the passage hole and making beams around the beam penetrate the thin film, while maintaining a temperature of a periphery of the passage hole in the thin film to be higher than an evaporation temperature of impurities adhering to the periphery; and detecting the beam having passed through the passage hole by a sensor arranged at a position away from the thin film by a distance based on which the beam having passed through the passage hole can be detected by the sensor as a detection value with contrast discernible from the beams which have penetrated the thin film.

12. The method according to claim 11, wherein the temperature of the periphery of the passage hole is controlled by a width size of an opening, which does not support the thin film, formed in a support base supporting the thin film.

* * * * *